US006539613B1

(12) United States Patent
Ulmer

(10) Patent No.: US 6,539,613 B1
(45) Date of Patent: *Apr. 1, 2003

(54) METHOD OF FORMING TRIMMABLE RESISTORS

(75) Inventor: Kenneth R. Ulmer, Brazoria, TX (US)

(73) Assignee: Intermedics, Inc., Angleton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/473,281

(22) Filed: Dec. 28, 1999

Related U.S. Application Data

(62) Division of application No. 09/096,908, filed on Jun. 12, 1998, now Pat. No. 6,047,463.

(51) Int. Cl.[7] .............................................. H01C 17/06
(52) U.S. Cl. ........................ 29/620; 29/621; 29/610.1; 29/614; 338/309; 338/308; 427/96; 427/101
(58) Field of Search .................... 29/613, 620, 621, 29/842, 852, 610.1, 614; 338/258, 295, 308, 309, 310, 312, 320, 270, 275, 226; 427/96, 101–103, 523–526

(56) References Cited

U.S. PATENT DOCUMENTS

| 2,886,476 A | * | 5/1959 | Dumesnil | 117/212 |
|---|---|---|---|---|
| 3,336,558 A | | 8/1967 | Wright | 338/217 |
| 3,432,792 A | | 3/1969 | Hatcher, Jr. | 338/311 |
| 3,555,485 A | | 1/1971 | Solow | 338/252 |
| 3,775,725 A | * | 11/1973 | Endo | 338/262 |
| 4,121,189 A | * | 10/1978 | Kuhl et al. | 338/226 |
| 4,127,934 A | * | 12/1978 | Bartley | 29/626 |
| 4,179,797 A | | 12/1979 | Johnson | 29/610 R |
| 4,249,302 A | * | 2/1981 | Crepeau | 29/830 |
| 4,266,282 A | | 5/1981 | Henle et al. | 365/52 |
| 4,300,115 A | | 11/1981 | Ansell et al. | 338/314 |
| 4,320,165 A | * | 3/1982 | Cash | 428/213 |
| 4,426,689 A | | 1/1984 | Henle et al. | 365/52 |
| 4,453,153 A | | 6/1984 | Capek et al. | 338/309 |
| 4,486,738 A | * | 12/1984 | Sadlo | 338/320 |
| 4,529,958 A | * | 7/1985 | Person et al. | 338/275 |
| 4,562,092 A | | 12/1985 | Wiech, Jr. | 427/58 |
| 4,630,025 A | | 12/1986 | Bourolleau | 338/309 |
| 4,646,057 A | * | 2/1987 | Reynolds | 338/312 |
| 4,651,126 A | * | 3/1987 | Kumar | 338/309 |
| 4,658,234 A | | 4/1987 | Takayanagi | 338/260 |
| 4,677,527 A | | 6/1987 | Pasterchick, Jr. et al. | 361/395 |
| 4,796,356 A | * | 1/1989 | Ozaki | 29/620 |
| 4,812,419 A | | 3/1989 | Lee et al. | 437/203 |
| 4,826,328 A | | 5/1989 | Sumal | 374/138 |
| 4,870,746 A | * | 10/1989 | Klasser | 29/620 |
| 4,994,215 A | | 2/1991 | Weich, Jr. | 264/27 |
| 5,116,641 A | | 5/1992 | Patel et al. | 427/96 |
| 5,164,699 A | | 11/1992 | Smith et al. | 338/310 |
| 5,185,292 A | | 2/1993 | VanVonno et al. | 437/180 |
| 5,346,750 A | | 9/1994 | Hatakeyama | 428/209 |
| 5,356,838 A | | 10/1994 | Kim | 437/226 |

(List continued on next page.)

FOREIGN PATENT DOCUMENTS

JP 404206802 * 7/1992 ................. 29/620

OTHER PUBLICATIONS

US 4,205,297, 5/1980, Johnson (withdrawn)*

Primary Examiner—Carl J. Arbes
Assistant Examiner—Minh Trinh
(74) Attorney, Agent, or Firm—Schwegman, Lundberg, Woessner & Kluth P.A.

(57) ABSTRACT

A method of forming trimmable resistors, resistor ray be embedded into a substrate. A portion of the resistor may be exposed, by segmenting the substrate, so that the resistor may be trimmed to a desired resistance level. Alternatively, a portion of a resistor may be embedded into a substrate, with another portion of the resistor being disposed on the outer surface of the substrate. The portion of the resistor on the outer surface may be trimmed to adjust the resistance of the resistor to a desired level.

18 Claims, 4 Drawing Sheets

U.S. PATENT DOCUMENTS

| | | |
|---|---|---|
| 5,412,537 A | 5/1995 | Magill et al. ............... 361/777 |
| 5,414,404 A | 5/1995 | Jeong et al. ................ 338/307 |
| 5,552,631 A | 9/1996 | McCormick ................ 257/666 |
| 5,593,722 A * | 1/1997 | Otani .......................... 427/101 |
| 5,600,101 A | 2/1997 | Sakai .......................... 174/261 |
| 5,621,619 A | 4/1997 | Seffernick et al. .......... 361/773 |
| 5,623,160 A | 4/1997 | Liberkowski ............... 257/621 |
| 5,668,409 A | 9/1997 | Gaul .......................... 257/723 |
| 5,684,273 A | 11/1997 | Erdle et al. ............... 174/72 B |
| 5,716,663 A | 2/1998 | Capote et al. ................ 427/96 |
| 5,726,857 A | 3/1998 | Salmonson et al. ......... 361/702 |
| 5,741,148 A | 4/1998 | Biernath ..................... 438/284 |
| 5,789,278 A | 8/1998 | Akram et al. ............... 438/118 |
| 5,847,930 A | 12/1998 | Kazle ......................... 361/736 |
| 5,851,645 A | 12/1998 | Glowasky et al. .......... 428/221 |
| 5,867,087 A | 2/1999 | Wuu et al. .................. 338/311 |
| 5,892,285 A | 4/1999 | Gonzalez et al. ........... 257/763 |
| 5,976,930 A | 11/1999 | Noble ........................ 438/253 |
| 5,994,997 A | 11/1999 | Brown et al. ............... 338/309 |
| 6,002,180 A | 12/1999 | Akram et al. ............... 257/783 |
| 6,047,463 A * | 4/2000 | Ulmer ......................... 29/620 |

* cited by examiner

METHOD OF FORMING TRIMMABLE RESISTORS

This application is a Division of U.S. Application Serial No. 09/096,908 filed Jun. 12, 1998, which is U.S. Pat. No. 6,047,463 issued Apr. 11, 2000.

BACKGROUND OF THE INVENTION

1. Field of the Invention

This invention relates generally to circuit fabrication and, more particularly, to resistor fabrication.

2. Background of the Related Art

For a variety of reasons, a person's heart may not function properly and, thus, endanger the person's well-being. Medical devices have been developed to facilitate heart function. For instance, if a person's heart does not beat properly, a cardiac stimulator may be used to provide relief. A cardiac stimulator is a medical device that delivers electrical stimulation to a patient's heart. A cardiac stimulator generally includes a pulse generator for creating electrical stimulation pulses and a conductive lead for delivering these electrical stimulation pulses to the designated portion of the heart.

Cardiac stimulators generally fall into two categories, pacemakers and defibrillators, although some cardiac stimulators may perform both functions. Pacemakers supply electrical pulses to the heart to keep the heart beating at a desired rate. Defibrillators supply a relatively large electrical pulse to the heart to help the heart recover from cardiac failure.

Like many other electrical devices, the electrical circuitry used in cardiac stimulators tends to benefit from miniaturization. Although there are many reasons that miniaturization is beneficial, it should be understood that current cardiac stimulators are devices that are typically implanted into a patient's body. As is well known, smaller implanted devices are generally more desirable. Also, the functionality of cardiac stimulators has increased dramatically over the past few decades. Thus, improved miniaturization allows functionality to be added without increasing the overall size of the cardiac stimulator.

Although a variety of electrical elements may be subject to miniaturization, this disclosure concentrates on the fabrication of resistors. Resistors may be fabricated on a substrate, such as ceramic or a printed circuit board, by depositing a film of a resistive material, such as ruthenium, on the surface of the substrate. The resistors are typically deposited using a thick film process, such as screen printing. Because most thick film processes exhibit fairly high tolerance levels, it is quite normal for resistors deposited in this nature to exhibit resistance values that vary from the desired value. Therefore, such resistors are typically trimmed by measuring the resistance of the resistor and by removing a portion of the resistive material to alter the resistance. Typically, lasers are used in accordance with well known methods to trim resistors to the proper resistance level.

However, the creation of resistors tends to occupy a relatively large area on the surface of the substrate. Because resistors occupy such a large surface area in proportion to other circuit components which must be surface mounted, it would be desirable to form such resistors somewhere other than the surface. Unfortunately, because the entire circuit must typically be complete before the deposited resistive material may be fired to form the final resistor, a resistor cannot be trimmed to the appropriate resistance level unless it is deposited at the surface.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a resistor that includes a substrate having a via therein, with electrically resistive material disposed in the via. A portion of the electrically resistive material is exposed along the via.

In accordance with another aspect of the present invention, there is provided a resistor that includes a substrate having an upper surface, a lower surface, and a peripheral edge. The substrate has an indentation formed in the peripheral edge between the upper surface and the lower surface. Electrically resistive material is disposed in the indentation such that a portion of the electrically resistive material is exposed between the upper surface and the lower surface.

In accordance with still another aspect of the present invention, there is provided a resistor that includes a substrate having a via therein and having an outer surface. A first portion of electrically resistive material is disposed in the via, and a second portion of electrically resistive material is disposed on the outer surface adjacent the via.

In accordance with yet another aspect of the present invention, there is provided a resistor that includes a substrate having a peripheral edge and having a first exterior layer, a second exterior layer, and at least one interior layer disposed between the first exterior layer and the second exterior layer. The at least one interior layer has a cavity therein open to the peripheral edge. Electrically resistive material is disposed in the cavity of the at least one interior layer such that a portion of the electrically resistive material is exposed at the peripheral edge of the substrate.

In accordance with a further aspect of the present invention, there is provided a cardiac stimulator that includes a housing and an electrical circuit disposed in the housing. At least one conductive lead is adapted to be electrically coupled between the electrical circuit and a patient's heart. The electrical circuit is formed on a substrate and includes a resistor as mentioned above.

In accordance with an even further aspect of the present invention, there is provided a method of forming a resistor that includes the acts of: (a) providing a substrate having an opening therein; (b) disposing electrically resistive material in the opening of the substrate; (c) exposing a portion of the electrically resistive material; and (d) trimming the exposed portion of the electrically resistive material to form a resistor having a given resistance.

In accordance with a still further aspect of the present invention, there is provided a method of forming a resistor that includes the acts of: (a) providing a substrate having an opening therein and having an outer surface; (b) disposing a first portion of electrically resistive material in the opening of the substrate; (c) disposing a second portion of electrically resistive material on the outer surface of the substrate; and (d) trimming the second portion of the electrically resistive material to form a resistor having a given resistance.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
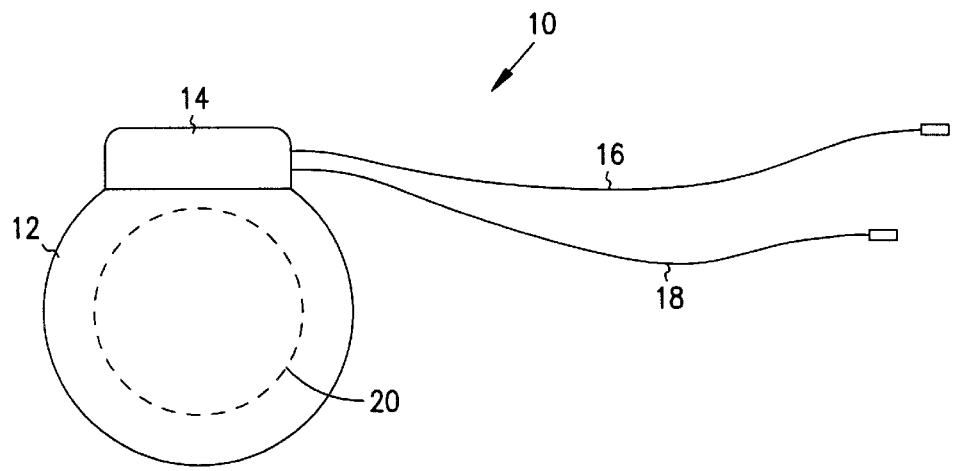
FIG. 1 illustrates a cardiac stimulator.

Turning now to the drawings, and referring initially to FIG. 1, an electronic device, such as a cardiac stimulator, is illustrated and generally designated by a reference numeral 10. The body of the cardiac stimulator 10 typically includes a case 12 and a header 14. One or more leads, such as an atrial lead 16 and a ventricular lead 18, are typically coupled to the header 14 to transmit electrical stimulation pulses to the patient's heart. The electrical stimulation pulses are generated by electronic circuitry 20 contained within the case 12 of the cardiac stimulator 10. The cardiac stimulator 10 also uses the electronic circuitry 20 to. perform its other functions, and the circuitry 20 typically includes a microprocessor that is coupled to a variety of other circuits, such as memory, stimulus generators, and sense circuits.

Figure 2:
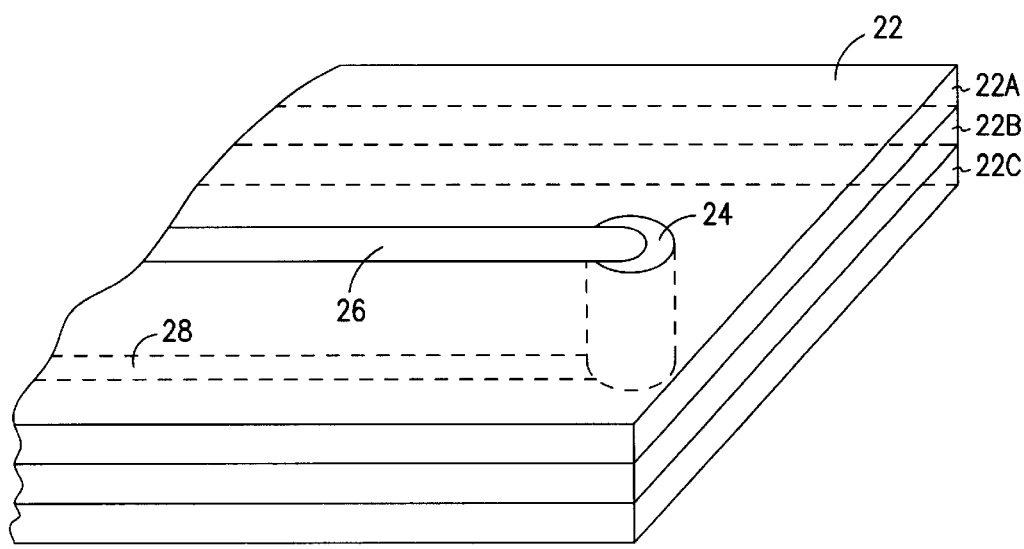
FIG. 2 illustrates a perspective view of a first embodiment of a trimmable embedded resistor.

The microprocessor and the related circuitry are typically mounted on a substrate. A portion of one such substrate is illustrated in FIG. 2 and designated by the reference numeral 22. As mentioned previously, resistors are among the variety of components that may be mounted on or in a substrate of an electronic circuit. As also mentioned previously, such resistors are typically formed on the surface of a substrate or on the surface of an internal layer of the substrate. Resistors formed below the surface of a substrate do not consume precious space on the outer surface of the substrate, but such resistors cannot be trimmed using conventional methods.

In an effort to address certain problems with previous resistor designs, FIG. 2 illustrates a resistor 24 that is formed within a via in the substrate 22. The resistor 24 is formed of an electrically resistive material, such as ruthenium, and it may be deposited within the via by any suitable method. It should be appreciated that the substrate 22 may be a single layer substrate, or the substrate 22 may be comprised of several layers 22A, 22B, and 22C, for instance. The resistor 24 is typically coupled to conductive traces 26 and 28. In the embodiment illustrated in FIG. 2, the conductive trace 26 is disposed on the upper surface of the substrate 22, and the conductive trace 28 is disposed on the bottom surface of the substrate 22. However, it should be understood that one or both conductive traces may also be disposed on one of the intermediate layers 22A, 22B, or 22C of the substrate 22.

Because the resistor 24 extends through at least one of the layers 22A, 22B, and 22C, it occupies less surface area than a surface-mounted resistor of similar resistance. However, unless manufacturing techniques having high tolerance levels are used during the fabrication of the resistor 24, it is unlikely that the resistance value of the resistor 24 will be accurate as initially fabricated. Therefore, it is advantageous to manufacture the resistor 24 to have a resistance that is less than the desired resistance. The resistor 24 may then be trimmed to increase its resistance.

Figure 3:
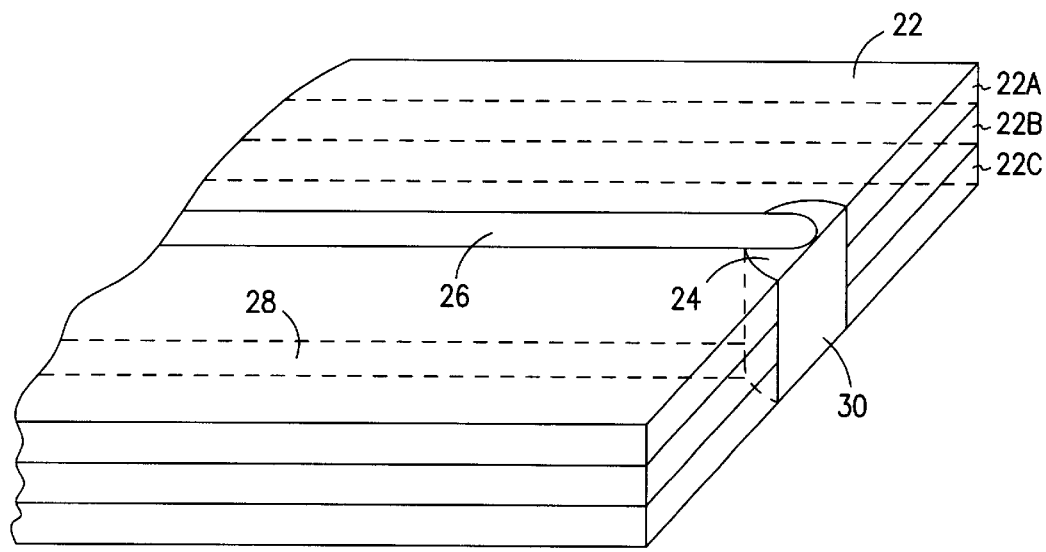
FIG. 3 illustrates a perspective view of an exposed portion of the resistor of FIG. 2.

To trim the resistor 24, a portion of the resistor 24 is exposed. For instance, as illustrated in FIG. 3, an edge of the substrate 22 may be removed, by sawing for instance, to expose a surface 30 of the resistor 24. Although FIG. 3 illustrates the portion 30 being exposed at the edge of the substrate 22, the edge could also be part of a seal ring, the side of an internal cavity, or any other suitable exposure, for instance. Advantageously, the resistor 24 is segmented approximately in half so that the exposed portion 30 represents a large surface area to facilitate the subsequent trimming procedure. Furthermore, the portion 30 of the resistor 24 may be exposed before the resistor 24 is fired or after. However, regardless of when the portion 30 of the resistor 24 is exposed, the laser trimming typically does not take place until after the resistor 24 is fired.

Figure 4:
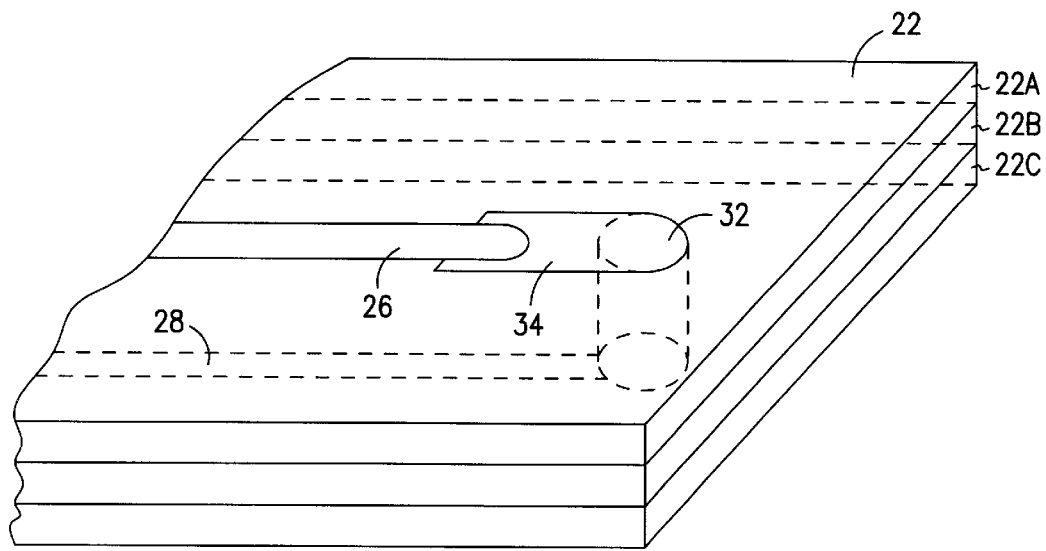
FIG. 4 illustrates a perspective view of a second embodiment of a trimmable embedded resistor.

Other configurations may also be used to fabricate an embedded resistor that may be trimmed to a desired resistance value. One example of an alternate configuration is illustrated in FIG. 4. In FIG. 4, elements similar to those mentioned previously will be designated using similar reference numerals for the sake of clarity. Accordingly, FIG. 4 illustrates a substrate 22. As before, the substrate 22 maybe composed of a single layer, or it may be composed of several layers 22A, 22B, and 22C, for instance. In this embodiment, a resistor 32 is formed within a via that extends through at least a portion of the substrate 22. As in the previous embodiment, the resistor 32 is advantageously formed of a suitable material, such as ruthenium.

However, unlike the previous embodiment, the resistor 32 includes an area of resistive material 34 that is disposed on an outer surface of the substrate 22, such as on the upper surface of the substrate 22. A conductor 26 is coupled to the portion 34 of resistive material, and a conductor 28 is coupled to the other end of the resistor 32. After the resistor 32 has been fabricated and fired, the portion 34 of the resistor 32 may be trimmed using conventional laser trimming methods to set the resistor 32 to the desired resistance level.

Figure 5:
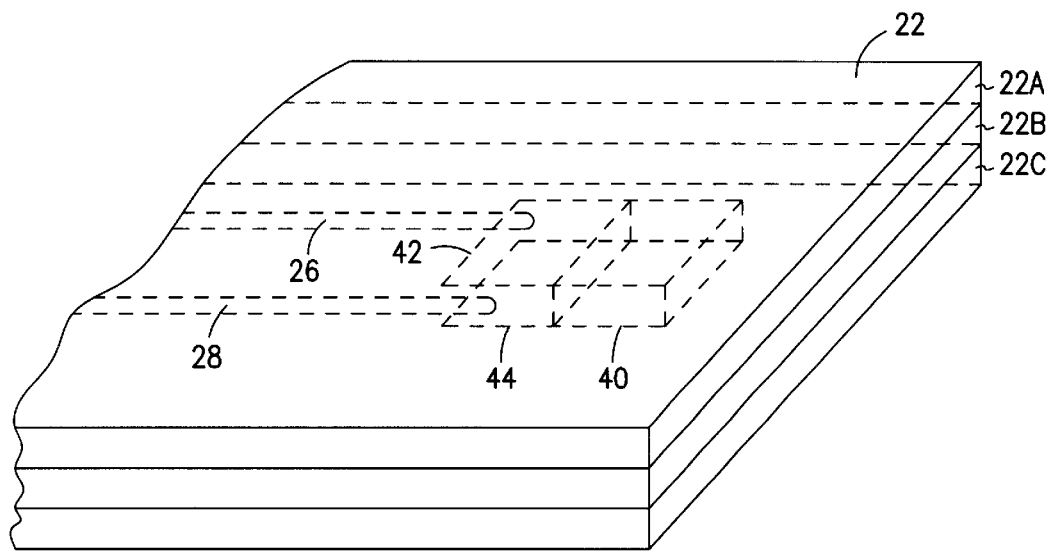
FIG. 5 illustrates a perspective view of a third embodiment of a trimmable embedded resistor.
Figure 6:
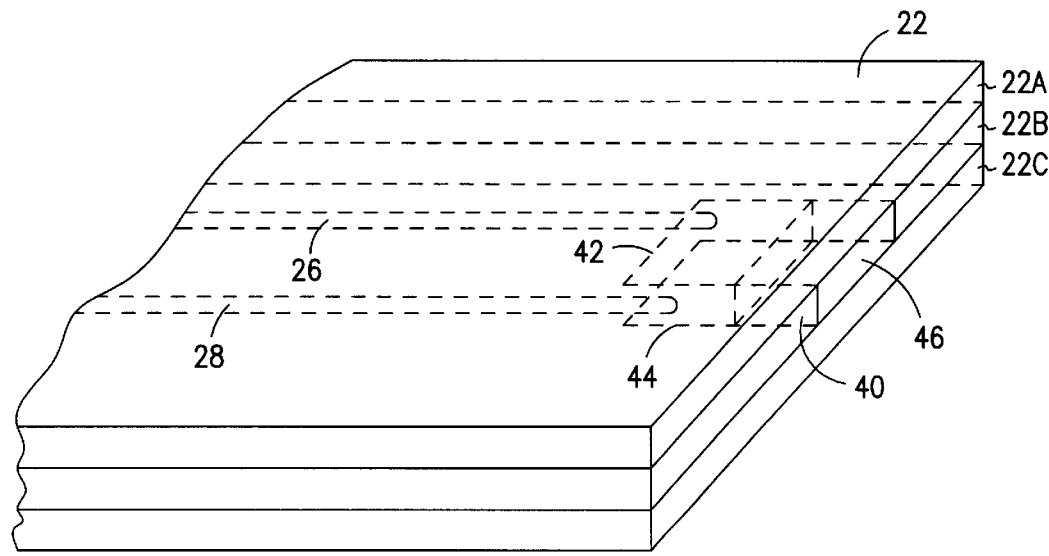
FIG. 6 illustrates a perspective view of an exposed portion of the resistor of FIG. 5.

FIGS. 5 and 6 illustrate a third embodiment of an embedded trimmable resistor. Again, for the purposes of clarity, elements similar to those discussed previously will be designated with the same reference numerals. Unlike the previously embodiments in which the resistor is illustrated as extending between an upper surface and a lower surface of the substrate 22, FIG. 5 illustrates a resistor 40 which resides in a cavity and only extends through an interior layer 22B of the substrate 22. Hence, the resistor 40 is completely covered by the layers 22A and 22C of the substrate 22. A conductor 26 may be disposed on the upper surface of the layer 22B and a conductor 28 may be disposed on the lower surface of the layer 22B to provide electrical coupling to the resistor 40. A portion 46 of the resistor 40 which extends through the layer 22B will ultimately be exposed, as illustrated in FIG. 6, so that the resistor 40 may be trimmed to the desired resistance level.

In addition to the portion of the resistor 40 that extends through the layer 22B, the resistor 40 may also include one or more portions 42 and 44 that are disposed on the upper or lower surfaces of the layer 22B, as illustrated in FIG. 5. The portions 42 and 44 may be embedded similar to conventional resistors that cannot be trimmed, and the conductors 26 and 28 are coupled to the respective portions 42 and 44. However, unlike conventional resistors, the resistance may be adjusted, because the main body of the resistor 40 may be segmented to expose the portion 46 for trimming.

Figure 7:
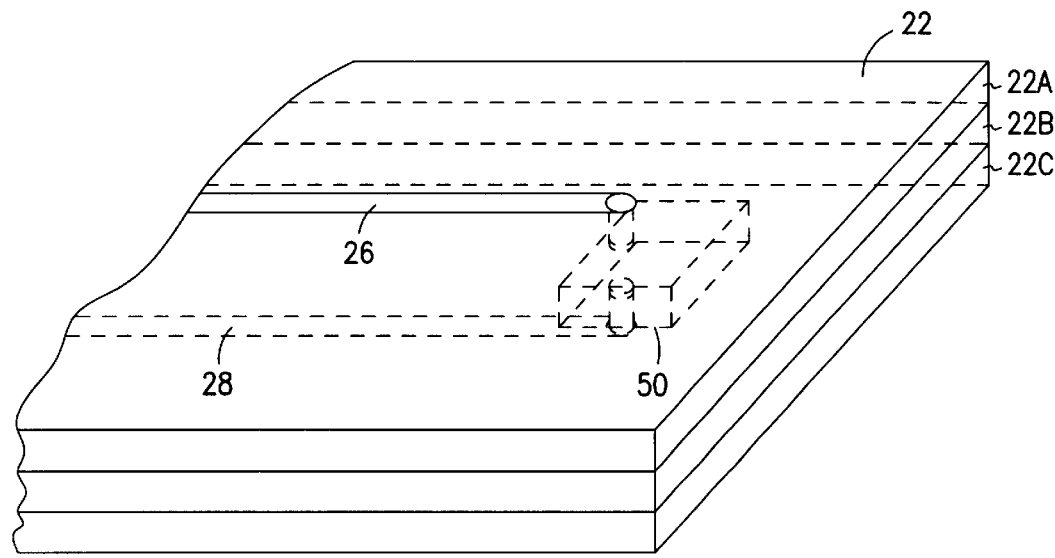
FIG. 7 illustrates a perspective view of a fourth embodiment of a trimmable embedded resistor.
Figure 8:
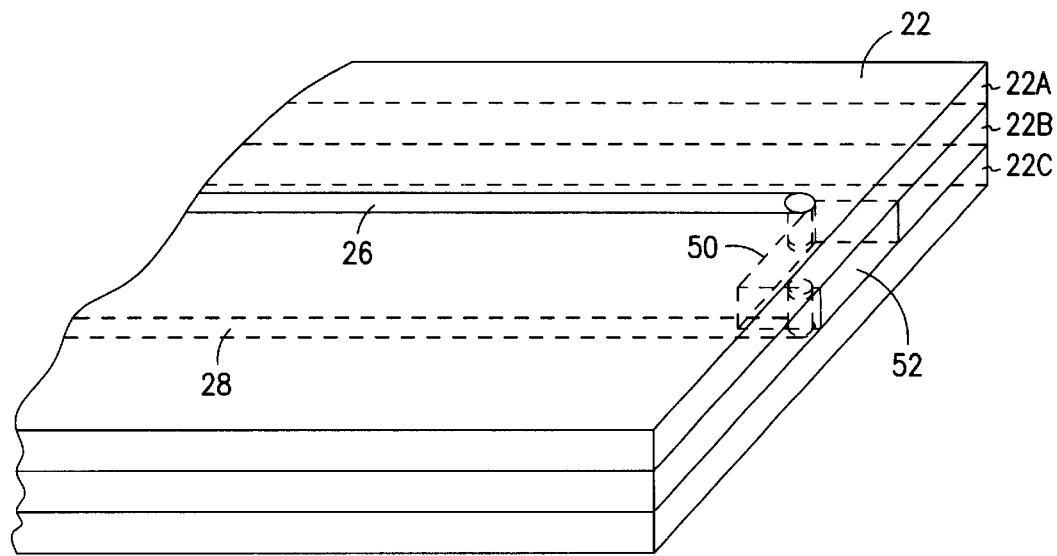
FIG. 8 illustrates a perspective view of an exposed portion of the, resistor of FIG. 7.

A fourth embodiment of an embedded trimmable resistor is illustrated in FIGS. 7 and 8. Like the resistor 40, the main portion of the resistor 50 is disposed through an interior layer 22B of the substrate 22. However, unlike the third embodiment, the conductors 26 and 28 that are coupled to the resistor 50 are disposed on the upper and lower outer surfaces, respectively, of the substrate 22. Therefore, to connect the conductors 26 and 28 to the embedded resistor 50, vias are formed in the upper layer 22A and the lower layer 22C. The vias may be filled with conductive material, 10 or the vias may be filled with resistive material similar to the resistive material used to form the resistor 50. Like the first and third embodiments described above, the resistor 50 is advantageously fabricated near an edge of the substrate 22 so that a portion of the edge may be removed to expose a portion 52 of the resistor 50. Once exposed, the portion 52 of the resistor 50 may be trimmed to adjust the resistance of the resistor 50 to the desired level.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a resistor comprising:
    providing a substrate having an opening therein and having an outer surface;
    disposing a first portion of electrically resistive material in the opening of the substrate;
    disposing a second portion of electrically resistive material on the outer surface of the substrate;
    segmenting the substrate through the opening and the first portion; and
    trimming the second portion of the electrically resistive material to form a resistor having a given resistance.

2. The method, as set forth in claim 1, wherein the acts are performed in the recited order.

3. The method, as set forth in claim 1, wherein disposing the first portion and disposing the second portion comprise firing the electrically resistive material.

4. The method, as set forth in claim 1, wherein trimming the second portion comprises using a laser to remove a portion of the second portion of electrically resistive material.

5. The method of claim 1, wherein segmenting the substrate includes removing some of the first portion.

6. The method of claim 5, wherein removing some of the first portion includes trimming the first portion to form the resistor to a given resistance.

7. The method of claim 1, wherein segmenting the substrate includes exposing the first portion.

8. The method of claim 7, wherein exposing the first portion includes trimming the first portion.

9. A method of forming a resistor, comprising:
    providing an opening in a substrate;
    disposing a first electrically resistive material in the opening;
    disposing a second electrically resistive material on a surface of the substrate in contact with the first electrically resistive material;
    segmenting the substrate through the opening to expose a portion of the first electrically resistive material; and
    trimming at least one of the second electrically resistive material and the exposed portion of the first electrically resistive material.

10. The method of claim 9, wherein segmenting includes sawing the substrate.

11. The method of claim 9, wherein providing an opening includes providing a first substrate layer, a second substrate layer and an intermediate substrate layer between the first substrate layer and the second substrate layer; and providing the opening in the intermediate substrate layer.

12. The method of claim 11, wherein disposing the second electrically resistive material includes disposing the second electrically resistive material on a surface of one of the first substrate layer and the second substrate layer.

13. The method of claim 12, wherein trimming includes lazing the at least one of the second electrically resistive material and the exposed portion of the first electrically resistive material.

14. The method of claim 9, wherein trimming includes lazing the at least one of the second electrically resistive material and the exposed portion of the first electrically resistive material.

15. The method of claim 9 wherein trimming at least one of the exposed portion of the first electrically resistive material and the second resistive material includes trimming so that the first and second electrically resistive material have a desired resistance.

16. The method of claim 9, wherein providing the opening includes covering the opening with an upper substrate layer and a lower substrate layer.

17. The method of claim 9, wherein providing the opening includes providing a cavity open to a peripheral surface of the substrate.

18. A method of forming a resistor in a cardiac stimulator, comprising:
    providing a substrate that has an opening and an outer surface in a cardiac stimulator;
    disposing a first electrically resistive material in the opening;
    disposing a second electrically resistive material on the outer surface and in contact with the first electrically resistive material;
    segmenting the substrate through the opening and the first electrically resistive material; and
    trimming at least one of the first electrically resistive material and the second resistive material to form a resistor having a given resistance.

* * * * *